(12) United States Patent
So et al.

(10) Patent No.: US 11,353,500 B2
(45) Date of Patent: Jun. 7, 2022

(54) CONTACTOR AND HANDLER

(71) Applicant: Synax Co., Ltd., Matsumoto (JP)

(72) Inventors: Vincent So, San Francisco, CA (US); Takamitsu Aihara, Koriyama (JP)

(73) Assignee: Synax Co., Ltd., Matsumoto (JP)

( * ) Notice: Subject to any disclaimer, the term of this patent is extended or adjusted under 35 U.S.C. 154(b) by 0 days.

(21) Appl. No.: 17/073,447

(22) Filed: Oct. 19, 2020

(65) Prior Publication Data

US 2021/0033667 A1 Feb. 4, 2021

Related U.S. Application Data

(63) Continuation of application No. PCT/JP2019/038659, filed on Sep. 30, 2019.

(30) Foreign Application Priority Data

Jan. 15, 2019 (JP) .............................. JP2019-004208

(51) Int. Cl.
*G01R 31/28* (2006.01)
(52) U.S. Cl.
CPC ................................ *G01R 31/2891* (2013.01)
(58) Field of Classification Search
CPC ............ G01R 31/2874; G01R 31/2875; G01R 31/2877
See application file for complete search history.

(56) References Cited

U.S. PATENT DOCUMENTS

| | | | |
|---|---|---|---|
| 2004/0216536 A1 | 11/2004 | Park | |
| 2005/0151549 A1* | 7/2005 | Okumura | G01R 31/2898 324/750.03 |
| 2006/0057875 A1 | 3/2006 | Eldridge et al. | |
| 2007/0132469 A1* | 6/2007 | Yano | G01R 31/2874 324/750.04 |
| 2009/0051381 A1 | 2/2009 | Hosoda et al. | |
| 2010/0129940 A1 | 5/2010 | Little | |
| 2011/0004343 A1 | 1/2011 | Iida | |

(Continued)

FOREIGN PATENT DOCUMENTS

| | | |
|---|---|---|
| JP | H02-128575 U | 10/1990 |
| JP | 2000-147053 A | 5/2000 |
| JP | 2002-207061 A | 7/2002 |

(Continued)

OTHER PUBLICATIONS

International Search Report for Application No. PCT/JP2019/038659 dated Nov. 12, 2019 with Written Opinion (9 Pages).

(Continued)

*Primary Examiner* — Tung X Nguyen
(74) *Attorney, Agent, or Firm* — Harness, Dickey & Pierce, P.L.C.

(57) ABSTRACT

A contactor includes a temperature adjustment mechanism, a cover and a path. The temperature adjustment mechanism increases and decreases temperature of an electronic component via a contact portion. The cover externally covers the temperature adjustment mechanism and includes an aperture portion. The path is allowed to supply gas to inside of the cover. The cover is configured to change a distance from the aperture portion to the contact portion.

6 Claims, 14 Drawing Sheets

(56) References Cited

U.S. PATENT DOCUMENTS

| 2013/0209199 A1* | 8/2013 | Maeda | G01R 31/2893 |
| | | | 414/222.01 |
| 2019/0072605 A1 | 3/2019 | Natsuizaka | |

FOREIGN PATENT DOCUMENTS

| JP | 2005-514596 A | 5/2005 |
| JP | 2011-011318 A | 1/2011 |
| JP | 2015-062994 A | 4/2015 |
| JP | 2016-164981 A | 9/2016 |
| JP | 2018-160592 A | 10/2018 |
| KR | 2011-0135382 A | 12/2011 |
| WO | WO-2007-023557 A1 | 3/2007 |
| WO | WO-2008-114457 A1 | 9/2008 |
| WO | WO-2010-007653 A1 | 1/2010 |
| WO | WO-2017-145495 A1 | 8/2017 |
| WO | WO-2018-056021 A1 | 3/2018 |

OTHER PUBLICATIONS

U.S. Appl. No. 17/072,155, filed Oct. 16, 2020, Vincent So et al.
International Search Report for Application No. PCT/JP2019/038658 dated Nov. 26, 2019 with Written Opinion (12 Pages).

* cited by examiner

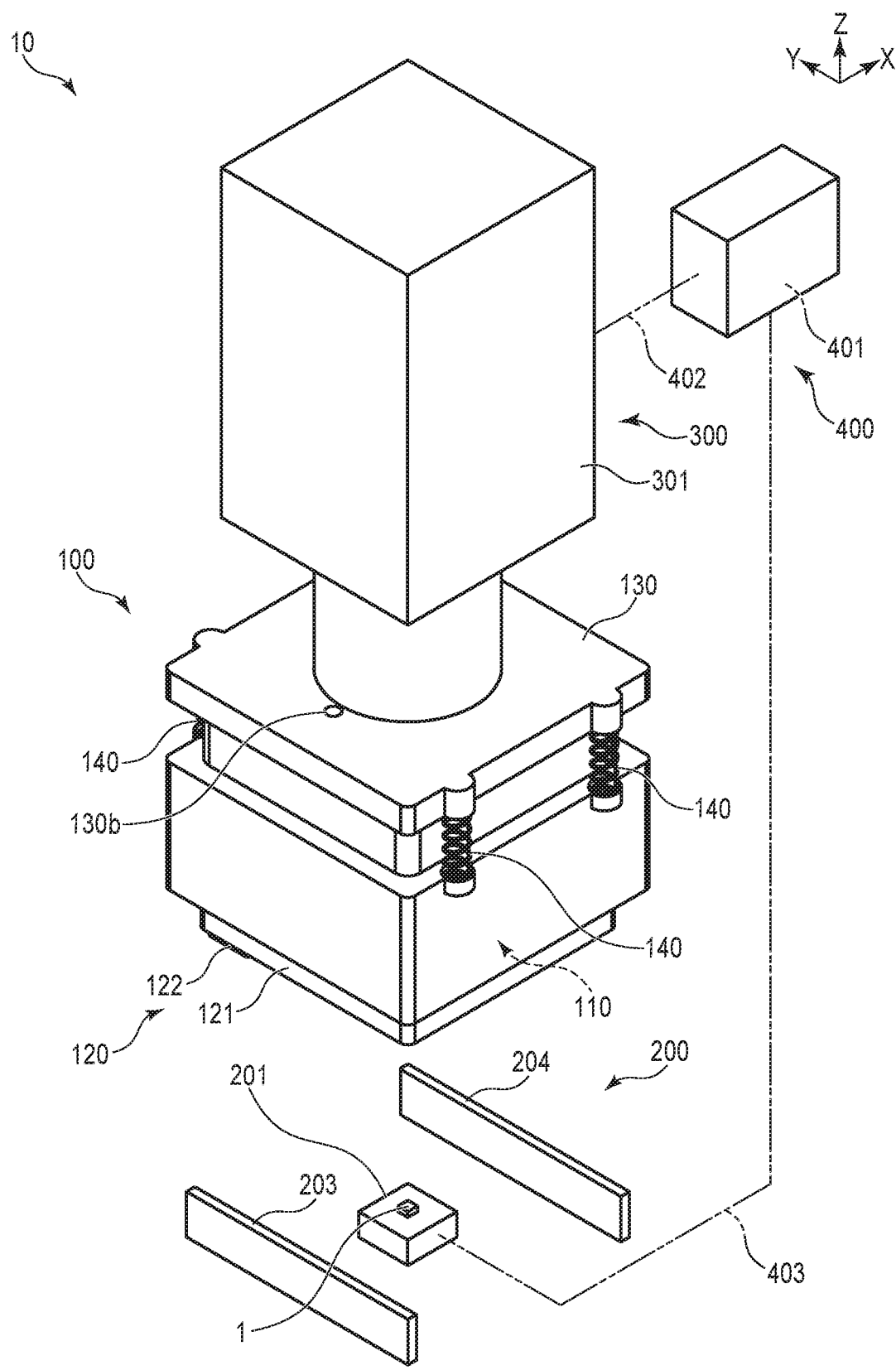
F I G. 1

CONTACTOR AND HANDLER

CROSS-REFERENCE TO RELATED APPLICATIONS

This application is a Continuation Application of PCT Application No. PCT/JP2019/038659, filed Sep. 30, 2019 and based upon and claiming the benefit of priority from prior Japanese Patent Application No. 2019-004208, filed Jan. 15, 2019, the entire contents of all of which are incorporated herein by reference.

BACKGROUND OF THE INVENTION

1. Field of the Invention

The present invention relates to a contactor and a handler.

2. Description of the Related Art

Conventionally, when the electric properties of an electronic component (IC chip) are inspected, the temperature of the electronic component may be adjusted in a predetermined temperature range. The predetermined temperature range is, for example, the temperature range from the upper limit temperature to the lower limit temperature in the specification of the electronic component. A handler which comprises a temperature adjustment mechanism to adjust the temperature of an electronic component is known (for example, see Patent Literature JP 2000-147053 A).

In the structure of Patent Literature JP 2000-147053 A, for example, in a case where the temperature of the inside of a temperature adjustment mechanism (thermostatic chamber) is set so as to be less than the temperature of external air, when an electronic component which has been inspected is removed from an inspection device (IC socket, etc.,) and an electronic component which has not been inspected yet is attached, the temperature adjustment mechanism is exposed to external air. At this time, the temperature of the inside of the temperature adjustment mechanism is increased. Thus, the structure of Patent Literature JP 2000-147053 A may have difficulties in effectively increasing or decreasing the temperature of electronic components.

BRIEF SUMMARY OF THE INVENTION

An aspect of the present invention is to provide a contactor and a handler allowed to prevent the effect caused by external air and effectively increase and decrease the temperature of electronic components.

According to one embodiment, a contactor comprises a temperature adjustment mechanism, a cover and a path. The temperature adjustment mechanism increases and decreases temperature of an electronic component via a contact portion. The cover externally covers the temperature adjustment mechanism, and comprises an aperture portion. The path is allowed to supply gas to inside of the cover. The cover is configured to change a distance from the aperture portion to the contact portion.

According to another embodiment, a handler comprises the contactor, an inspection device and a driving device. The inspection device inspects an electric property of the electronic component. The driving device causes the contactor and the inspection device to be close to each other and spaced apart from each other.

The present invention comprising the above structure can provide a contactor and a handler allowed to prevent the effect caused by external air and effectively increase and decrease the temperature of electronic components.

Additional aspects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a general perspective view showing the inside of an IC handler according to a first embodiment.

DETAILED DESCRIPTION OF THE INVENTION

First Embodiment

Figure 2:
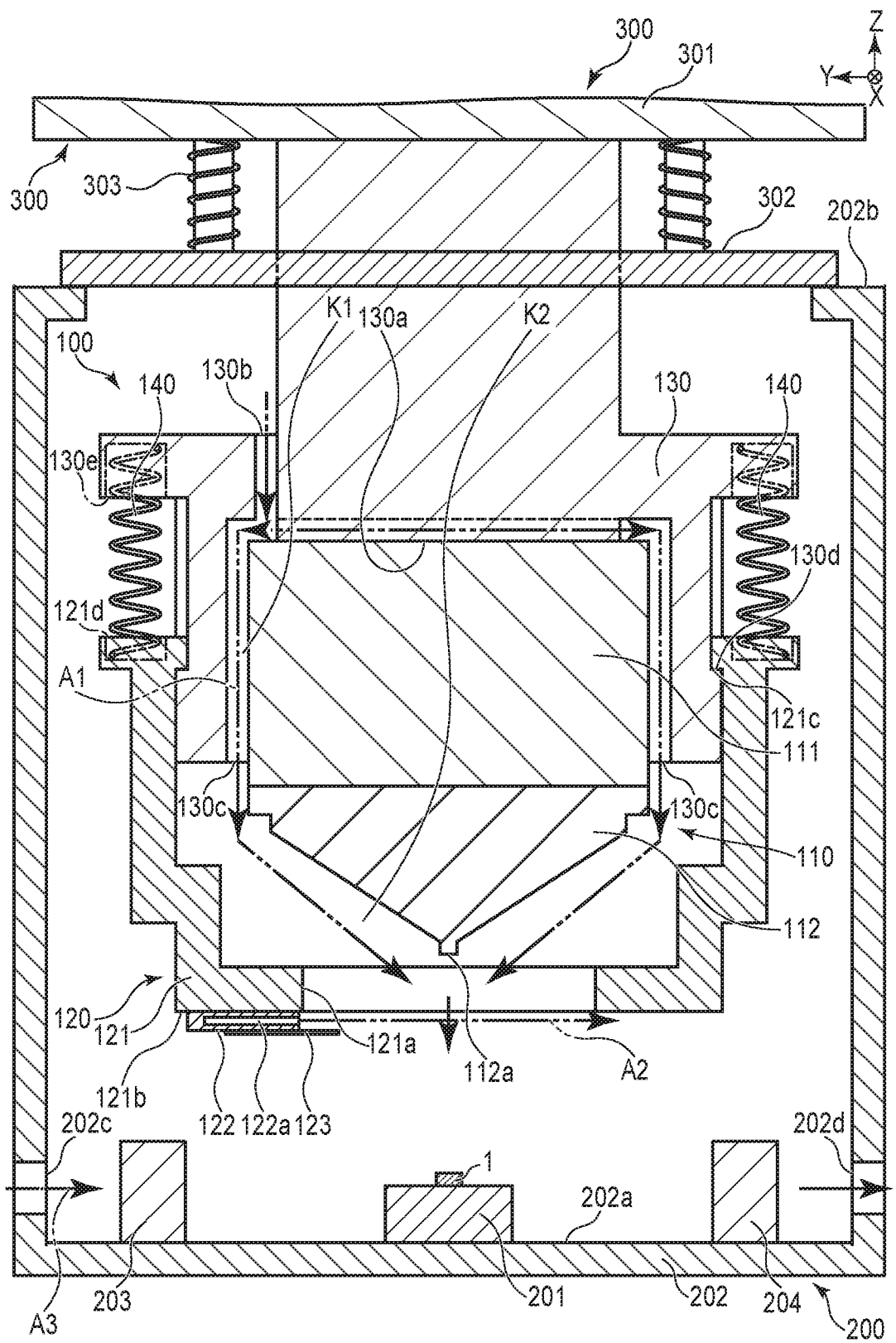
FIG. 2 is a general cross-sectional view of the IC handler of FIG. 1.

Hereinafter, this specification shows an example of an IC handler (handler) 10 including a contactor 100 as the first embodiment of the present invention. During the replacement of an IC chip 1 in an inspection device 200, the IC handler 10 of the first embodiment shields a temperature adjustment mechanism 110 provided in the contactor 100 against external air by the dry air A2 supplied from an air curtain 122 while supplying dry air A1 to the inside of a cover 121.

Figure 3:
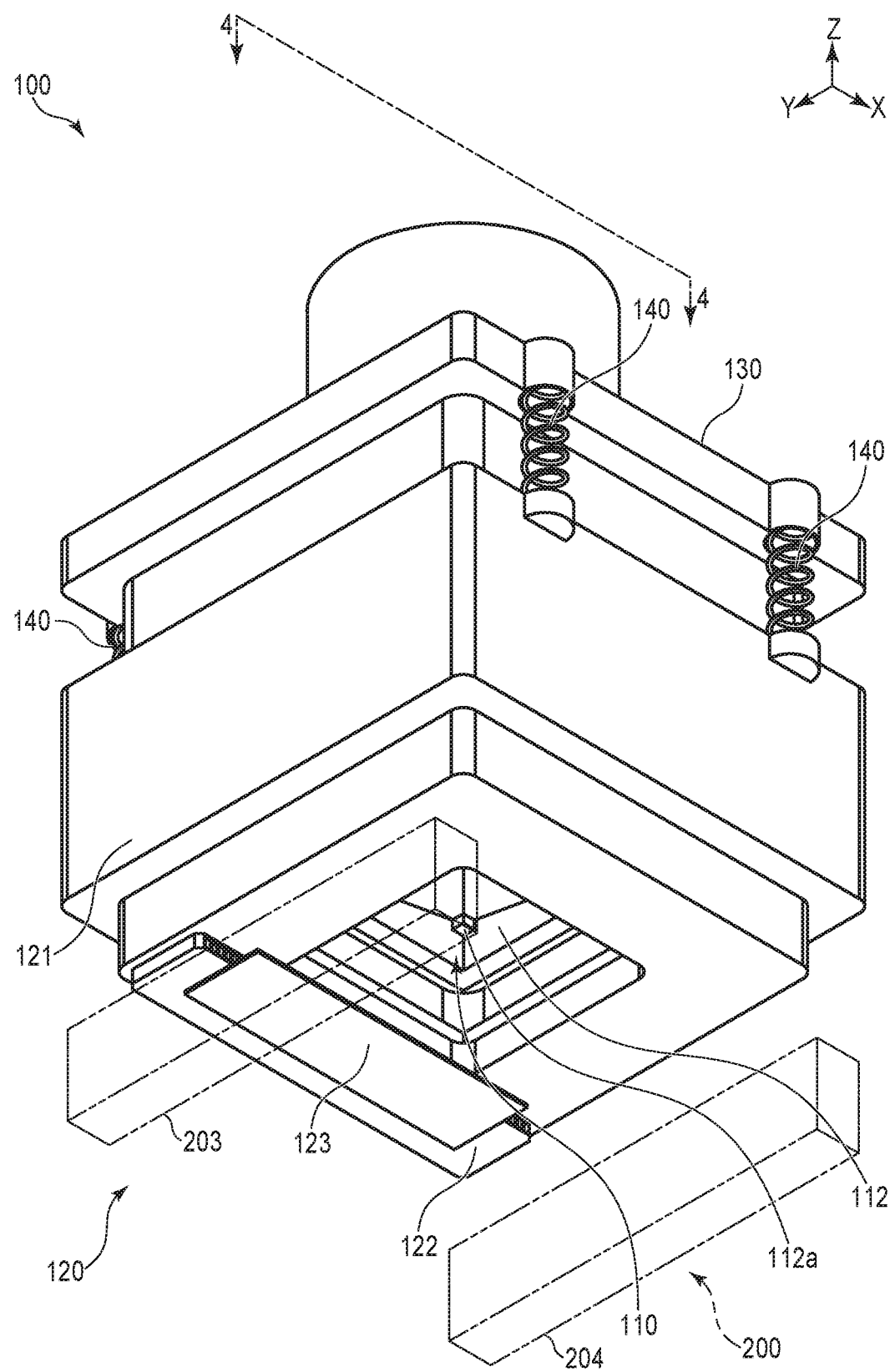
FIG. 3 is a general perspective view showing a part of the contactor and inspection device of FIG. 1.
Figure 4:
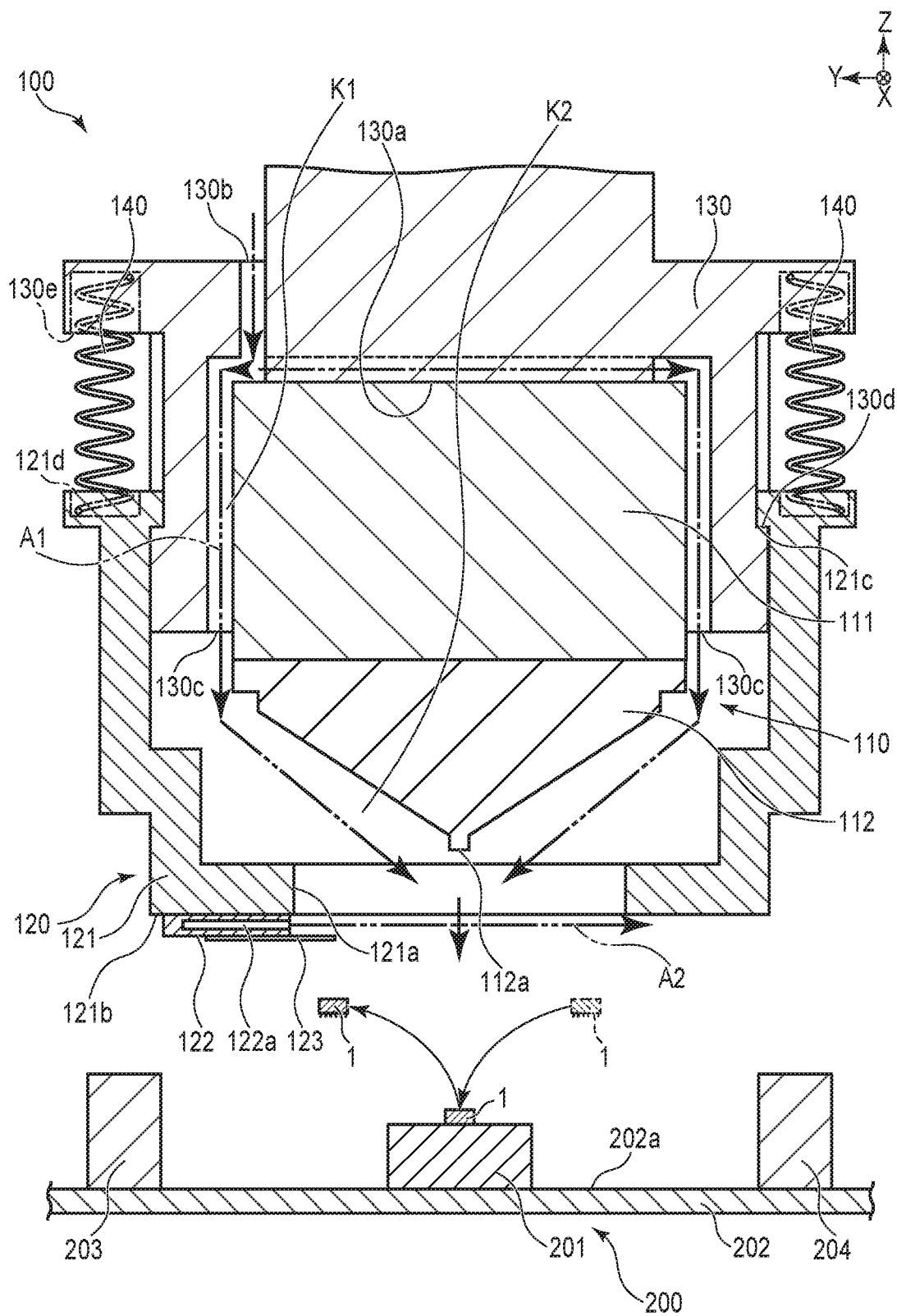
FIG. 4 is a general cross-sectional view of the contactor and the inspection device along the 4-4 line of FIG. 3.
Figure 5:
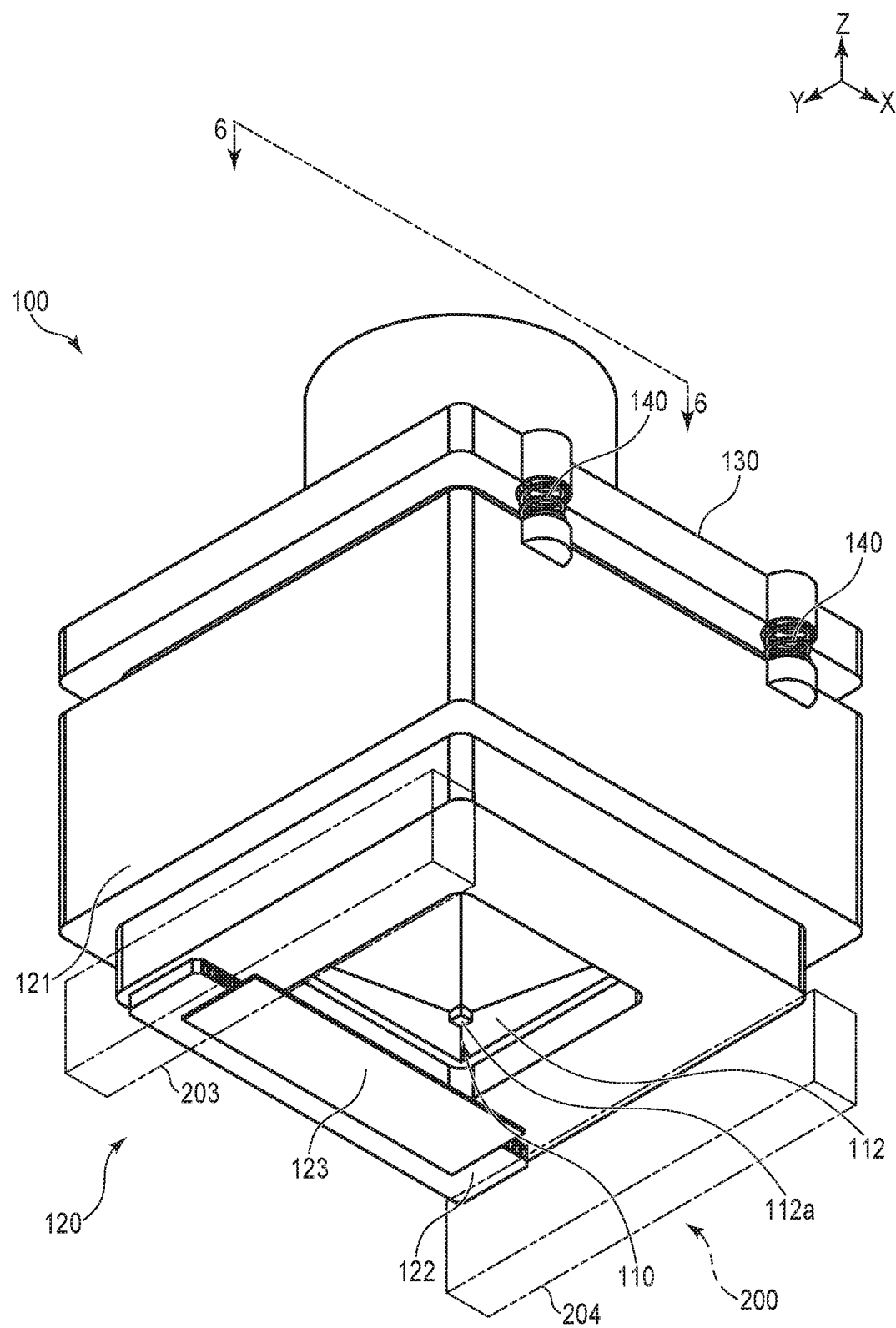
FIG. 5 is a general perspective view showing the state in which the contactor of FIG. 3 descends and is in contact with the inspection device.
Figure 6:
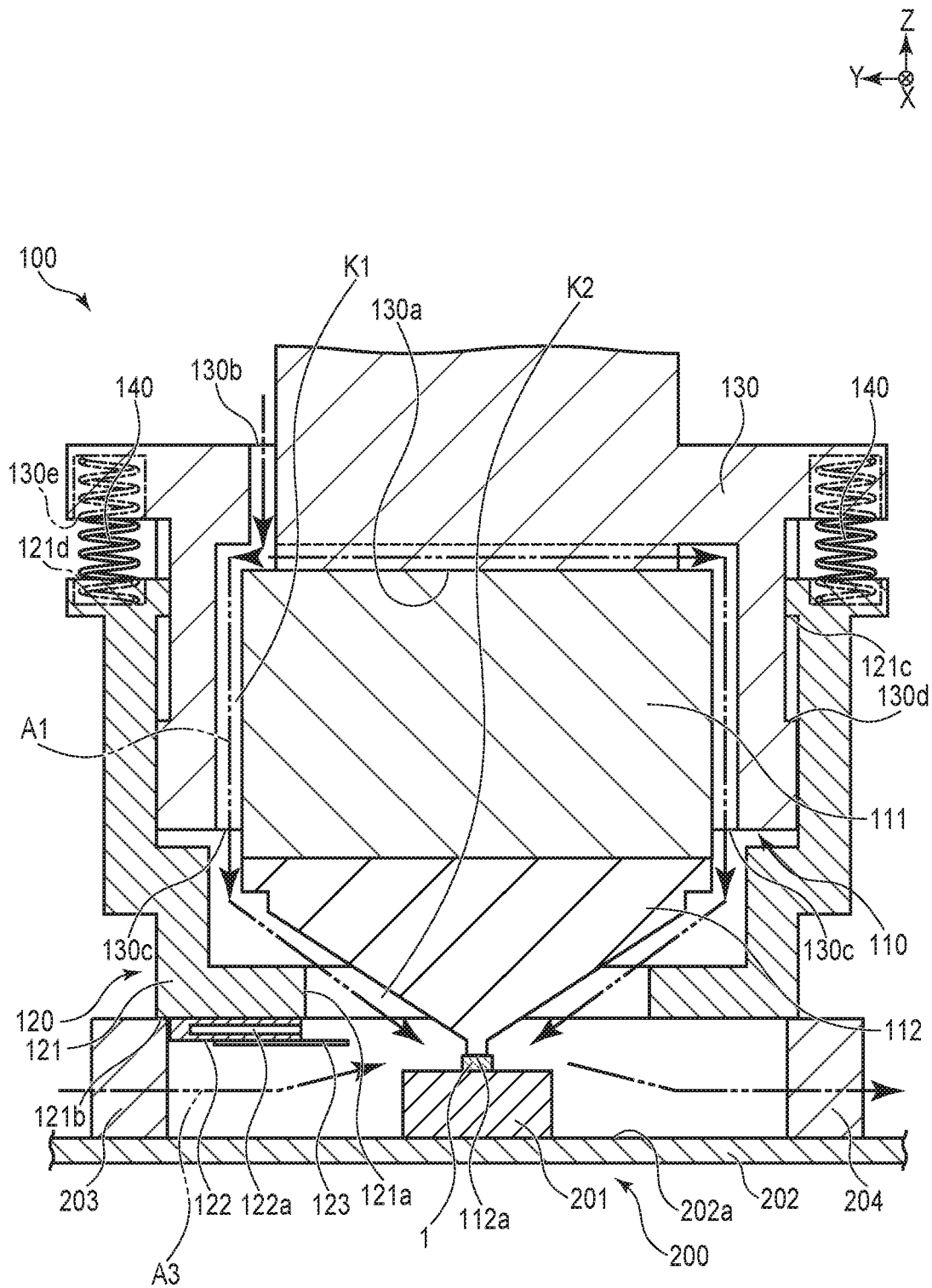
FIG. 6 is a general cross-sectional view of the contactor and the inspection device along the 6-6 line of FIG. 5.

The structure of the IC handler 10 of the first embodiment is explained with reference to FIG. 1 to FIG. 6. FIG. 1 is a general perspective view showing the inside of the IC handler 10 according to the first embodiment. In FIG. 1, a part of the inspection device 200 and a driving device 300 is omitted. FIG. 2 is a general cross-sectional view of the IC handler 10 of FIG. 1. FIG. 3 is a general perspective view showing a part of the contactor 100 and inspection device 200 of FIG. 1. FIG. 4 is a general cross-sectional view of the contactor 100 and the inspection device 200 along the 4-4 line of FIG. 3. FIG. 5 is a general perspective view showing the state in which the contactor 100 of FIG. 3 descends and is in contact with the inspection device 200. FIG. 6 is a general cross-sectional view of the contactor 100 and the inspection device 200 along the 6-6 line of FIG. 5.

The IC handler 10 of the first embodiment comprises the contactor 100, the inspection device 200, the driving device 300 and a control device 400 as shown in FIG. 1.

The contactor 100 is a device which increases and decreases the temperature of the IC chip 1. The contactor 100 includes the temperature adjustment mechanism 110, a shielding mechanism 120, a holding member (connection mechanism) 130 and an extension spring (bias mechanism) 140 as shown in FIG. 4 to FIG. 6.

The temperature adjustment mechanism 110 increases and decreases the temperature of the IC chip (electronic component) 1 via a contact portion 112a as shown in FIG. 6. The temperature adjustment mechanism 110 includes a heating-cooling unit 111 and a plunger 112. The heating-cooling unit 111 includes, for example, active thermal control (ATC). The heating-cooling unit 111 adjusts the temperature of the IC chip 1 in a predetermined temperature range via the plunger 112. The predetermined temperature range is the temperature range from the upper limit temperature to the lower limit temperature in the specification of the IC chip 1. The plunger 112 is equivalent to what is called a heatsink. The plunger 112 contains, for example, metal having high thermal conductivity, and is cooled or heated by the bonded heating-cooling unit 111. At the lower end of the plunger 112, the contact portion 112a which comes into contact with the IC chip 1 is formed.

The shielding mechanism 120 includes the cover 121, the air curtain (blower mechanism) 122 and a current plate 123. As shown in FIG. 4, the shielding mechanism 120 shields the temperature adjustment mechanism 110 of the contactor 100 against external air and adjusts the temperature by the dry air A2 supplied from the air curtain 122 while supplying dry air A1 to the inside of the cover 121.

As shown in FIG. 4, the cover 121 externally covers the temperature adjustment mechanism 110. The cover 121 is formed in a square-tube shape which penetrates in a perpendicular direction Z. The cover 121 comprises an aperture portion 121a, a lower surface 121b, an upper portion stopper 121c and an insertion hole 121d. The aperture portion 121a is located in the lower part of the cover 121. The contact portion 112a of the plunger 112 is inserted into and passes through the cover 121 in the perpendicular direction Z. The lower surface 121b is in contact with a first mechanical stopper 203 and a second mechanical stopper 204 provided in the inspection device 200 when the cover 121 descends. The upper portion stopper 121c comprises a step protruding to the central side and facing the lower side in the upper part of the inner circumferential surface of the cover 121. The insertion hole 121d comprises a hole formed on the upper surface of the cover 121. The lower end of the extension spring 140 is inserted into the insertion hole 121d. Path K2 to which dry air A1 (gas) can be supplied is formed between the internal side of the cover 121 and the plunger 112. Path K2 forms a dry air space.

As shown in FIG. 3 and FIG. 4, the air curtain 122 comprises a plurality of gaps 122a which open in a depth direction Y. The gaps 122a are arranged in a lateral width direction X. The air curtain 122 is attached to the lower surface 121b of the cover 121 so as to be adjacent to the aperture portion 121a of the cover 121 without blocking the aperture portion 121a. As shown in FIG. 4, the air curtain 122 forms an air current which blocks the aperture portion 121a of the cover 121 by supplying the dry air A2 supplied from the outside in the depth direction Y. Thus, the air curtain 122 forms an external air shutoff layer or an external air blocking layer under the aperture portion 121a of the cover 121.

As shown in FIG. 3, the current plate 123 is formed so as to be long and rectangular along the air curtain 122. The current plate 123 is attached so as to protrude from the air curtain 122 to the aperture portion 121a side of the cover 121 under the air curtain 122. The current plate 123 rectifies the dry air A2 supplied from the air curtain 122 along the aperture portion 121a of the cover 121.

As shown in FIG. 4, the cover 121 is connected to the holding member (connection mechanism) 130 so as to be movable with respect to the temperature adjustment mechanism 110. The holding member 130 is formed in a square-tube shape in which a hollow is provided in the lower part and the upper part is closed. The holding member 130 comprises a housing portion 130a, an air inlet portion 130b, a discharge portion 130c, an upper portion stopper 130d and a plurality of insertion holes 130e. The housing portion 130a is a hole which is depressed from the lower side to the upper side of the holding member 130. The heating-cooling unit 111 is housed in the housing portion 130a. The air inlet portion 130b and the discharge portion 130c are equivalent to an end and the other end of path K1 of dry air A1 provided along the boundary surface between the housing portion 130a and the heating-cooling unit 111. The upper portion stopper 130d comprises a recess formed in the outer circumference of the holding member 130 and is in contact with the upper portion stopper 121c of the cover 121 descending relatively to the holding member 130. Each insertion hole 130e comprises a hole formed at the outer edge of the upper part of the holding member 130 and facing the lower side. The upper end of the extension spring 140 is inserted into the insertion hole 130e.

As shown in FIG. 4, the extension spring (bias mechanism) 140 biases the cover 121 in a direction (lower side) in which the aperture portion 121a moves away from the contact portion 112a such that the contact portion 112a of the plunger 112 is housed in the inside of the aperture portion 121a of the cover 121. The extension spring 140 is inserted into the insertion hole 121d of the cover 121 and the insertion hole 130e of the holding member 130 in a retracted state. As shown in FIG. 3, the extension spring 140 is provided in a corner portion of the holding member 130. For the bias mechanism, an actuator which is extended by compressed air may be used. Since the cover 121 descends by its own weight, the bias mechanism is not an essential structural member.

As shown in FIG. 1 to FIG. 6, the inspection device 200 is a device which inspects the electric properties of the IC chip 1. The inspection device 200 includes an inspection unit 201, a housing unit 202, the first mechanical stopper 203 and the second mechanical stopper 204.

As shown in FIG. 6, the inspection unit 201 inputs a test signal to the attached IC chip 1 while supplying driving power, and inspects the electric properties of the IC chip 1.

As shown in FIG. 1, etc., the housing unit 202 is equivalent to a purge box (dry air box). As shown in FIG. 4 to FIG. 6, etc., the housing unit 202 houses the inspection unit 201 in a concave inner part 202a. As shown in FIG. 2, the upper surface 202b of the housing unit 202 is in contact with a control plate 302 provided in the driving device 300. In the example of FIG. 2, a supply port 202c to which dry air A3 is supplied is provided on a side surface of the housing unit 202. A discharge port 202d through which dry air A3 is discharged is provided on the side surface facing the supply port 202c in the housing unit 202.

As shown in FIG. 4, FIG. 6, etc., the first mechanical stopper 203 and the second mechanical stopper 204 are provided in the inner part 202a of the housing unit 202 so as to face each other via the inspection unit 201. As shown in FIG. 6, the first mechanical stopper 203 and the second mechanical stopper 204 are in contact with the lower surface 121b of the descending cover 121 and stops the cover 121.

As shown in FIG. 1 and FIG. 2, the driving device 300 is a device which causes the contactor 100 to approach and move away from the inspection device 200. The driving device 300 includes a linear motion stage 301, the control plate 302 and a bias spring 303. The holding member 130 of the contactor 100 is attached to the linear motion stage 301. When the linear motion stage 301 causes the holding member 130 to descend and ascend, the contactor 100 approaches and moves away from the inspection device 200. The control plate 302 is in contact with the upper surface 202b of the housing unit 202. The bias spring 303 applies a bias force to the control plate 302.

As shown in FIG. 1, the control device 400 controls the contactor 100, the inspection device 200 and the driving device 300. The control device 400 includes a controller 401, a first control cable 402 and a second control cable 403. The controller 401 includes a read-only memory (ROM), a central processing unit (CPU), a random-access memory (RAM), etc. In the ROM, a control program which controls the heating-cooling unit 111 of the contactor 100, the linear motion stage 301 of the driving device 300 and the inspection unit 201 of the inspection device 200 is stored. The CPU executes the control program. In the RAM, while the CPU executes the control program, various types of data associated with control are temporarily stored. The controller 401 is electrically connected to the heat-cooling unit 111 and the linear motion stage 301 via the first control cable 402. The controller 401 is electrically connected to the inspection unit 201 via the second control cable 403. For example, the controller 401 is operated via a personal computer.

The operation of the contactor 100 and the IC handler 10 of the first embodiment is explained with reference to FIG. 3 to FIG. 6.

As shown in FIG. 3 and FIG. 4, the temperature adjustment mechanism 110 and the cover 121 of the contactor 100 are allowed to be provided at a first position (the position shown in FIG. 3 and FIG. 4) where the contact portion 112a of the temperature adjustment mechanism 110 is housed in the inside of the aperture portion 121a of the cover 121. The lower surface 121b of the cover 121 is spaced apart from the first mechanical stopper 203 and the second mechanical stopper 204 of the inspection device 200. The cover 121 is caused to be in a descended state by the weight of the cover 121 and the bias force of the extension spring 140. The upper portion stopper 121c of the cover 121 is hooked on the upper portion stopper 130d of the holding member 130. At the first position, an IC chip 1 which has been inspected is removed from the inspection unit 201, and an IC chip 1 which has not been inspected yet is attached to the inspection unit 201.

As shown in FIG. 5 and FIG. 6, the temperature adjustment mechanism 110 and the cover 121 of the contactor 100 are allowed to be provided at a second position (the position shown in FIG. 5 and FIG. 6) where the contact portion 112a of the temperature adjustment mechanism 110 protrudes from the aperture portion 121a of the cover 121 to the outside. The lower surface 121b of the cover 121 is in contact with the first mechanical stopper 203 and the second mechanical stopper 204 of the inspection device 200. As the holding member 130 is in a descended state such that the cover 121 is in contact with the housing unit 202, the cover 121 is in an ascended state relative to the holding member 130. At the second position, the IC chip 1 is inspected by the inspection unit 201. Dry air A3 passes through between the first mechanical stopper 203 and the second mechanical stopper 204. For the convenience sake, FIG. 6 shows that dry air A3 crosses the first mechanical stopper 203 and the second mechanical stopper 204.

The action and effect of the contactor 100 and the IC handler 10 of the first embodiment are explained with reference to FIG. 1 to FIG. 6.

As shown in FIG. 4, FIG. 6, etc., the contactor 100 of the first embodiment is structured such that the cover 121 is allowed to change the distance from the aperture portion 121a to the contact portion 112a. The IC handler 10 of the first embodiment includes the above contactor 100 as shown in FIG. 1.

In this structure, the cover 121 and the temperature adjustment mechanism 110 can be relatively moved such that the aperture portion 121a of the cover 121 comes close to the contact portion 112a of the temperature adjustment mechanism 110. Thus, the temperature of the contact portion 112a of the temperature adjustment mechanism 110 of the contactor 100 can be effectively adjusted by the dry air A1 supplied to the inside of the cover 121. As a result, the contactor 100 and the IC handler 10 are allowed to prevent the effect caused by external air and effectively increase and decrease the temperature of the IC chip 1.

In particular, in this structure, in a case where the temperature of the contact portion 112a of the temperature adjustment mechanism 110 is set to a low temperature below the dew point of external air, it is possible to prevent dew condensation or freezing in the contact portion 112a from when an IC chip 1 which has been inspected is removed from the inspection device 200 until an IC chip 1 which has not been inspected yet is attached to the inspection device 200. As a result, the short-circuit of each IC chip 1 which is in contact with the contact portion 112a by liquid can be prevented. The degradation of the contact portion 112a by liquid can be also prevented. In addition, the above structure can omit a process for increasing the temperature of the contact portion 112a so as to be greater than or equal to a dew point to prevent dew condensation or freezing for the inspection of each IC chip 1 and returning the temperature to a low temperature, and the time associated with the process.

Moreover, in the above structure, in a case where the temperature of the contact portion 112a of the temperature adjustment mechanism 110 is set to a low temperature below the dew point of external air, it is possible to prevent the temperature of the contact portion 112a from increasing because of the exposure to external air having ambient temperature while the IC chip 1 is replaced in the inspection device 200. As a result, it is possible to omit a process for adjusting the temperature of the contact portion 112a so as to be a low temperature for the inspection of each IC chip 1 and the time associated with the process.

In this structure, the incursion of external air into the inside of the cover 121 can be prevented by setting the pressure of the inside of the cover 121 so as to be greater than the pressure of the outside of the cover 121 by adjusting the amount of the dry air A1 supplied to the inside of the cover 121. As a result, the contactor 100 and the IC handler 10 are allowed to further prevent the effect caused by external air and very effectively increase and decrease the temperature of the IC chip 1.

In the contactor 100 of the first embodiment, the temperature adjustment mechanism 110 and the cover 121 are configured to be provided at the first position (the position shown in FIG. 3 and FIG. 4) where the contact portion 112a is housed in the inside of the aperture portion 121a. Further, the temperature adjustment mechanism 110 and the cover 121 are configured to be provided at the second position (the position shown in FIG. 5 and FIG. 6) where the contact portion 112a protrudes from the aperture portion 121a to the outside.

In this structure, as shown in FIG. 3 and FIG. 4, the IC handler 10 is allowed to shield the temperature adjustment mechanism 110 of the contactor 100 against external air and adjust the temperature while supplying dry air A1 to the inside of the cover 121 during the replacement of the IC chip 1 in the inspection device 200. As shown in FIG. 5 and FIG. 6, the IC handler 10 is allowed to supply dry air A3 to the housing unit 202 while supplying dry air A1 to the inside of the cover 121 during the inspection of the IC chip 1 in the inspection device 200.

The contactor 100 of the first embodiment comprises the air curtain (blower mechanism) 122 which forms an air current which blocks the aperture portion 121a of the cover 121 (in other words, the air current formed by dry air A2 shown in FIG. 4).

In this structure, as shown in FIG. 3 and FIG. 4, the IC handler 10 is allowed to shield the temperature adjustment mechanism 110 of the contactor 100 against external air and adjust the temperature by the dry air A2 supplied along the aperture portion 121a of the cover 121 from the air curtain 122 during the replacement of the IC chip 1 in the inspection device 200. The IC handler 10 is allowed to continuously supply dry air A2 along the aperture portion 121a of the cover 121 from the air curtain 122 and supply dry air A3 to the housing unit 202 during the inspection of the IC chip 1 in the inspection device 200.

As shown in FIG. 4, etc., the contactor 100 of the first embodiment comprises the holding member (connection mechanism) 130 and the extension spring (bias mechanism) 140. The cover 121 is connected to the holding member 130 so as to be movable with respect to the temperature adjustment mechanism 110. The extension spring 140 biases the cover 121 in a direction in which the aperture portion 121a moves away from the contact portion 112a such that the contact portion 112a is housed in the inside of the aperture portion 121a.

In this structure, the cover 121 and the temperature adjustment mechanism 110 can be continuously and relatively moved such that the aperture portion 121a of the cover 121 always comes the closest to the contact portion 112a of the temperature adjustment mechanism 110. The cover 121 can be caused to stably descend by the extension spring 140.

In the contactor 100 of the first embodiment, as shown in FIG. 4, etc., the current plate 123 rectifies the dry air A2 supplied from the air curtain 122 along the aperture portion 121a of the cover 121.

In this structure, the dry air A2 supplied along the aperture portion 121a of the cover 121 from the air curtain 122 can be guided along the aperture portion 121a of the cover 121.

Second Embodiment

Hereinafter, this specification shows an example of a contactor 500 included in an IC handler as the second embodiment of the present invention with reference to FIG. 7 to FIG. 10. Unless otherwise specified, the present embodiment has the same structure as the first embodiment. During the replacement of an IC chip 1 in an inspection device 200, the IC handler of the second embodiment shields a temperature adjustment mechanism 110 provided in the contactor 100 against external air by an iris diaphragm 524 provided in a shielding mechanism 520, etc., while supplying dry air A1 to the inside of a cover 121.

Figure 7:
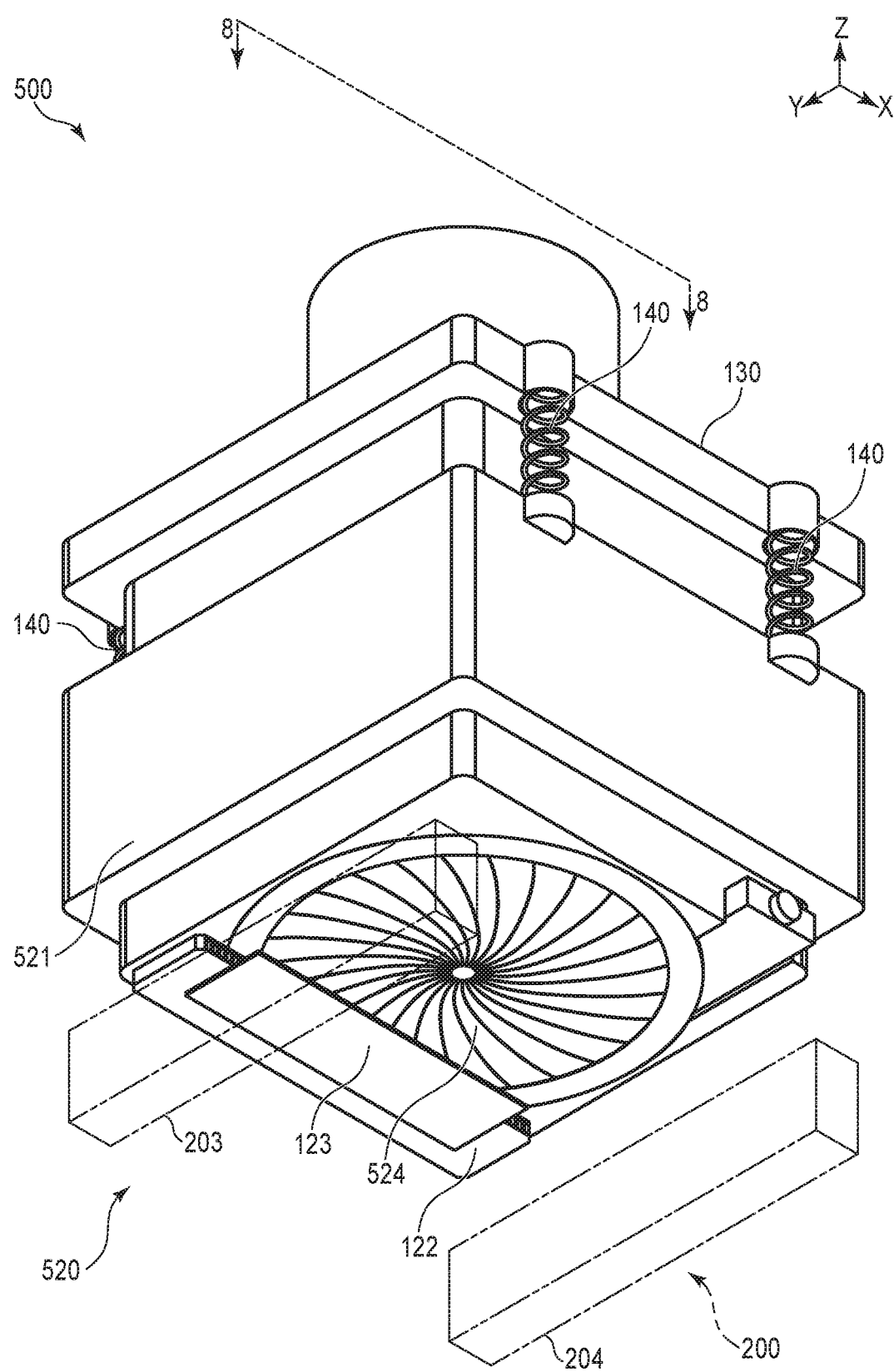
FIG. 7 is a general perspective view showing a part of a contactor and an inspection device according to a second embodiment.
Figure 8:
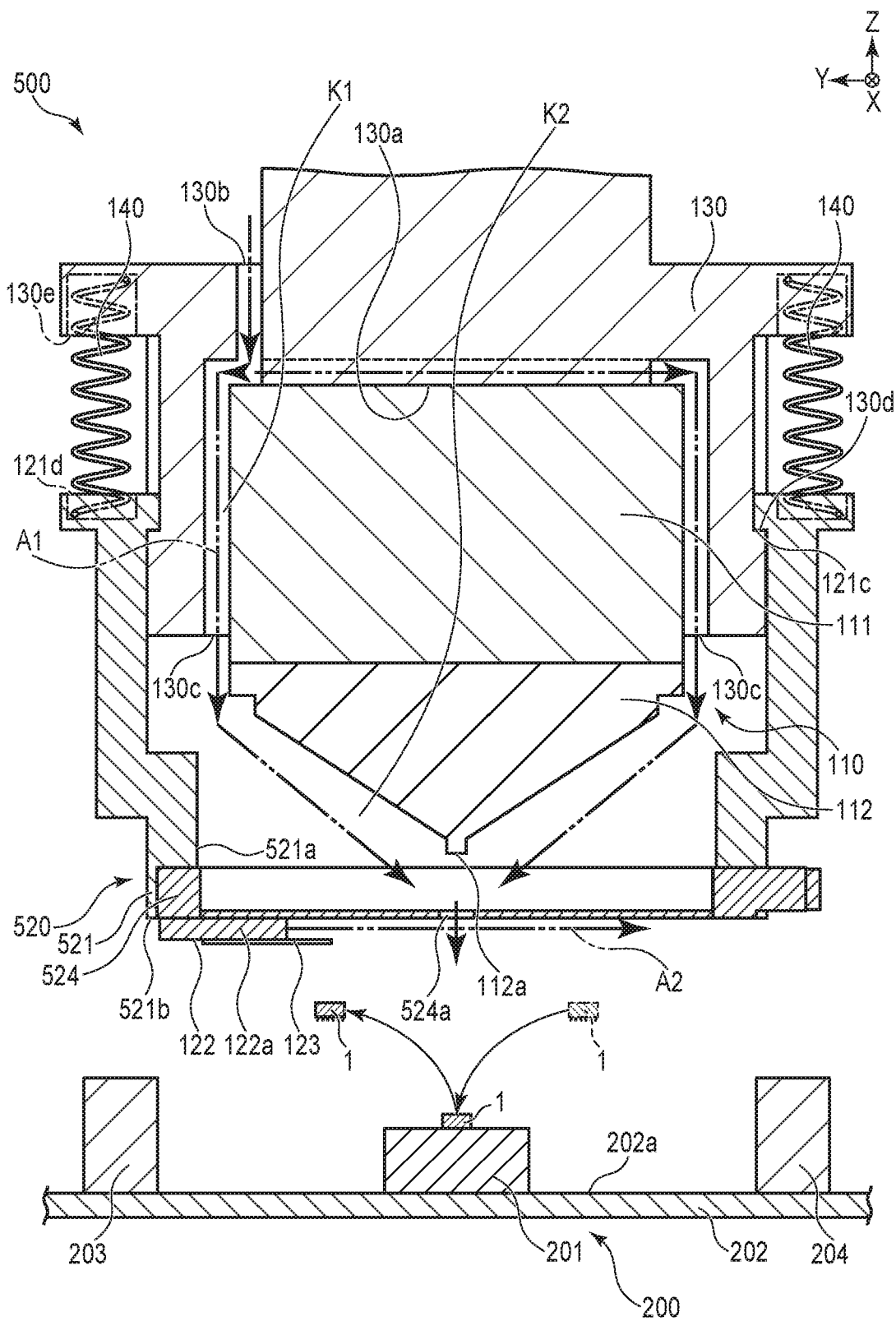
FIG. 8 is a general cross-sectional view of the contactor and the inspection device along the 8-8 line of FIG. 7.
Figure 9:
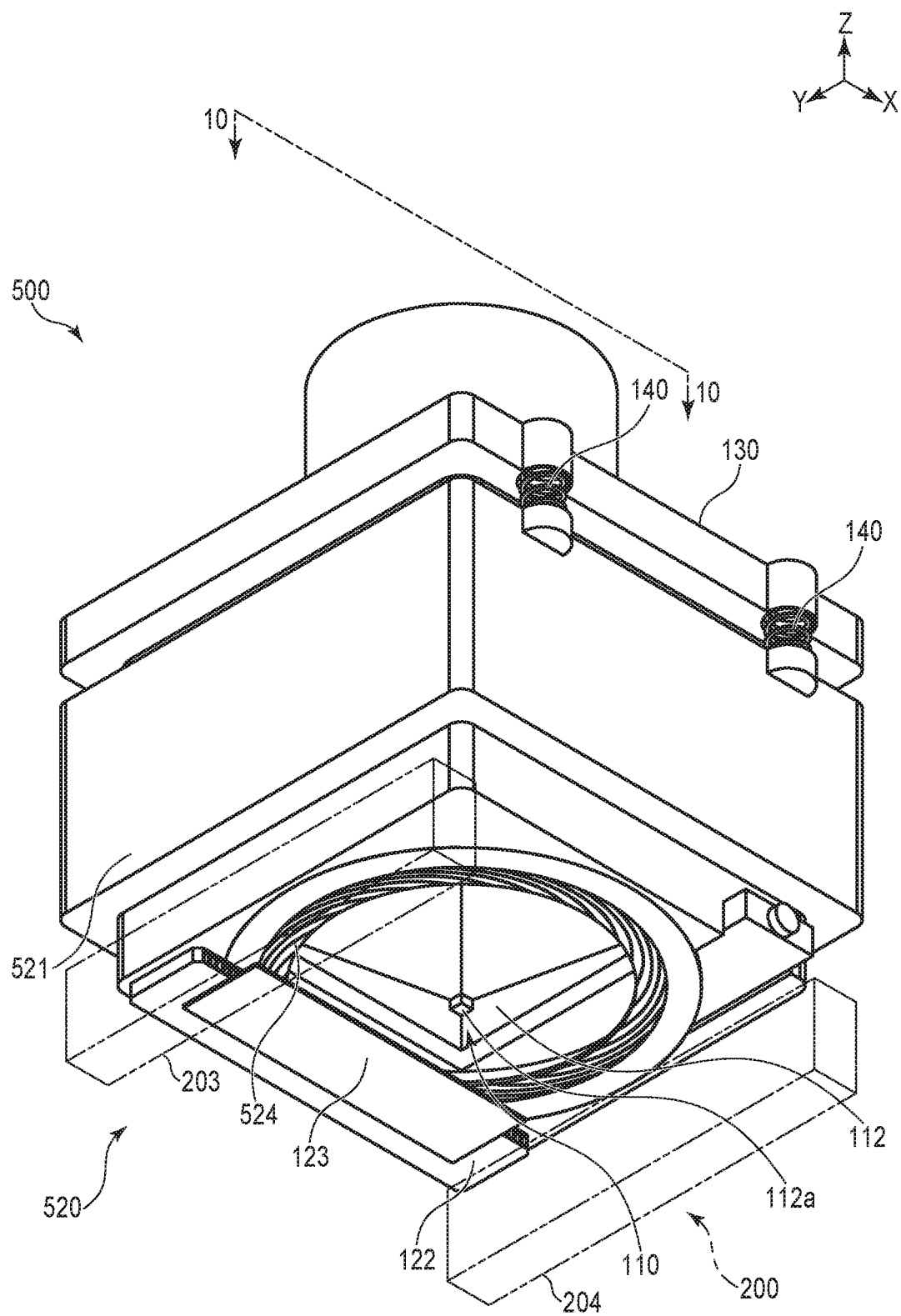
FIG. 9 is a general perspective view showing the state in which the contactor of FIG. 7 descends and is in contact with the inspection device.
Figure 10:
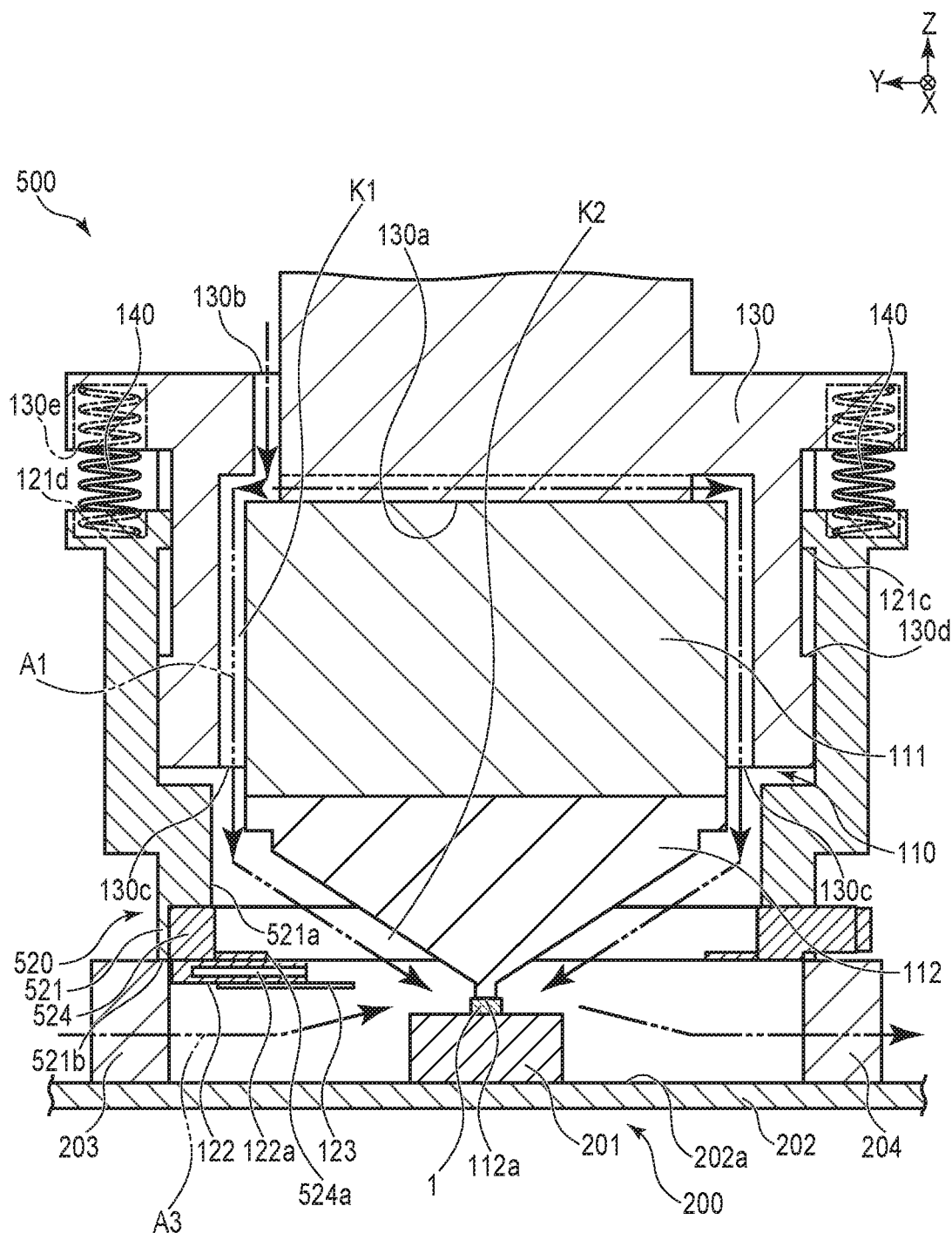
FIG. 10 is a general cross-sectional view of the contactor and the inspection device along the 10-10 line of FIG. 9.

The structure of the contactor 500 of the second embodiment is explained with reference to FIG. 7 to FIG. 10. FIG. 7 is a general perspective view showing a part of the contactor 500 and the inspection device 200 according to the second embodiment. FIG. 8 is a general cross-sectional view of the contactor 500 and the inspection device 200 along the 8-8 line of FIG. 7. FIG. 9 is a general perspective view showing the state in which the contactor 500 of FIG. 7 descends and is in contact with the inspection device 200. FIG. 10 is a general cross-sectional view of the contactor 500 and the inspection device 200 along the 10-10 line of FIG. 9.

The IC handler of the second embodiment comprises the contactor 500 unique to the second embodiment, and the inspection device 200, a driving device 300 and a control device 400 which are the same as the first embodiment. Thus, the contactor 500 unique to the IC handler of the second embodiment is explained.

The contactor 500 includes the shielding mechanism 520 unique to the second embodiment, and the temperature adjustment mechanism 110, a holding member 130 and an extension spring 140 which are the same as the first embodiment. The shielding mechanism 520 includes a cover 521 and the iris diaphragm 524 which are unique to the second embodiment, and an air curtain 122 and a current plate 123 which are the same as the first embodiment. In the cover 521, to attach the iris diaphragm 524, an aperture portion 521a is formed so as to be larger than that of the cover 121 of the first embodiment, and a lower surface 521b is formed so as to be smaller than that of the cover 121 of the first embodiment. The iris diaphragm 524 physically shields the aperture portion 521a of the cover 521. The iris diaphragm 524 is equivalent to a variable open mechanism. The iris diaphragm 524 is what is called an iris mechanism, and changes the aperture diameter by cam operation, air pressure or motor driving. In the iris diaphragm 524, the amount of diaphragm is set so as to generate an aperture 524a for discharging dry air A1 even in a shielded state. In the shielding mechanism, in place of the iris diaphragm 524, an opening and closing shutter comprising a plurality of thin plates may be used.

The action and effect of the contactor 500 of the second embodiment are explained with reference to FIG. 7 to FIG. 10.

The contactor 500 of the second embodiment comprises the iris diaphragm (shielding mechanism) 524. The iris diaphragm 524 is allowed to shield the aperture portion 521a of the cover 521.

The IC handler of the second embodiment comprises the contactor 500, the inspection device 200, the driving device 300 and the control device 400. As shown in FIG. 7 and FIG. 8, the control device 400 controls the iris diaphragm 524 so as to shield the aperture portion 521a of the cover 521 in a state where a contact portion 112a is housed in the inside of the aperture portion 121a. As shown in FIG. 9 and FIG. 10, the control device 400 performs control such that the aperture portion 521a of the cover 521 is opened by the iris diaphragm 524 before the contact portion 112a protrudes to the outside of the aperture portion 521a.

This structure allows the temperature adjustment mechanism 110 of the contactor 500 to be physically shielded against external air and to be adjusted in terms of the temperature during the replacement of the IC chip 1 in the inspection device 200. As a result, the contactor 500 is allowed to sufficiently prevent the effect caused by external air and very effectively increase and decrease the temperature of the IC chip 1.

Third Embodiment

Hereinafter, this specification shows an example of a contactor 600 included in an IC handler as the third embodiment of the present invention with reference to FIG. 11 to FIG. 14. Unless otherwise specified, the present embodiment has the same structure as the first embodiment. During the replacement of an IC chip 1 in an inspection device 200, the IC handler of the third embodiment shields a temperature adjustment mechanism 110 provided in the contactor 100 against external air by a bellows 621N and an iris diagram 524 provided in an shielding mechanism 620, etc., while supplying dry air A1 to the inside of a cover 621.

Figure 11:
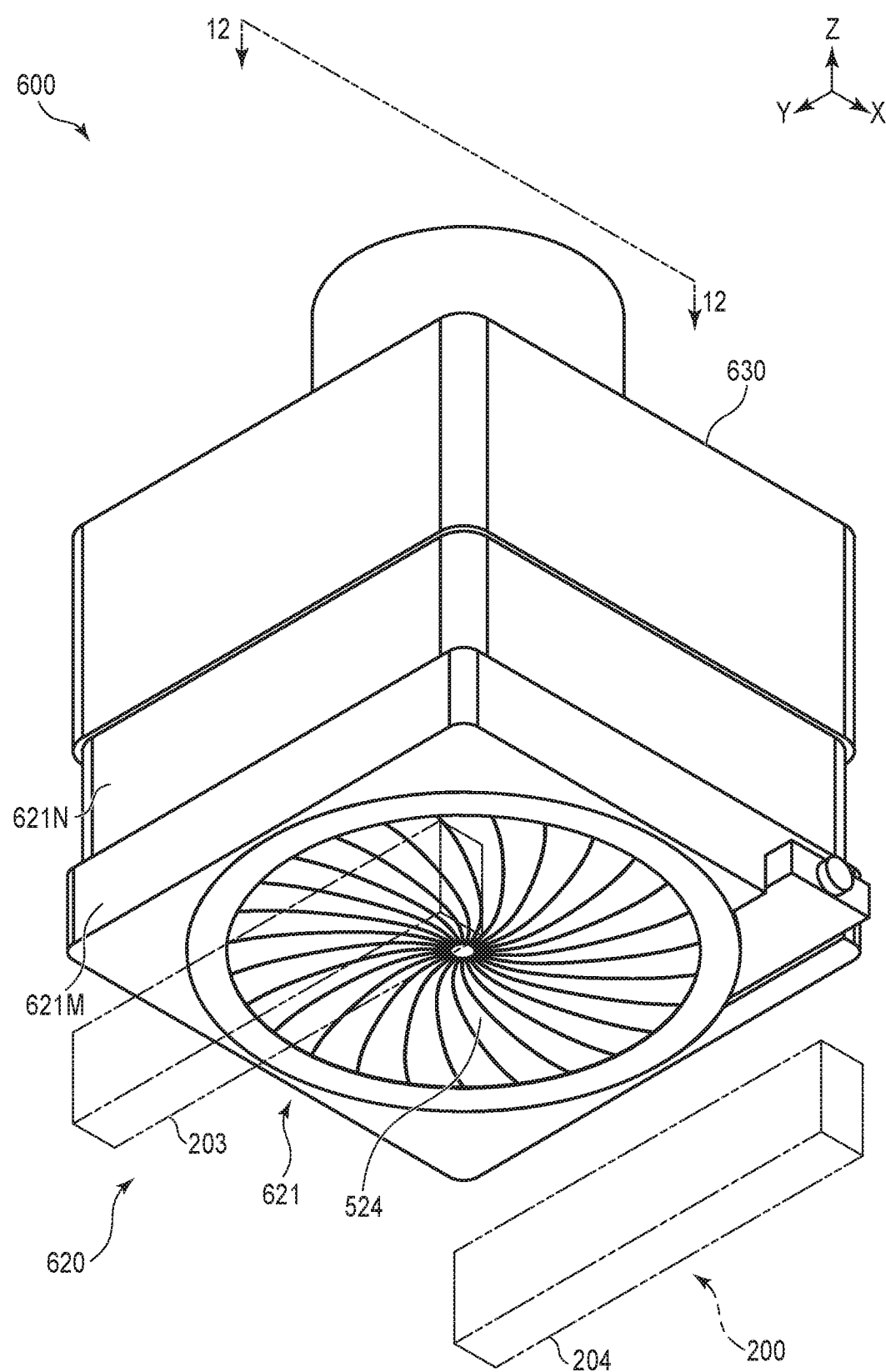
FIG. 11 is a general perspective view showing a part of a contactor and an inspection device according to a third embodiment.
Figure 12:
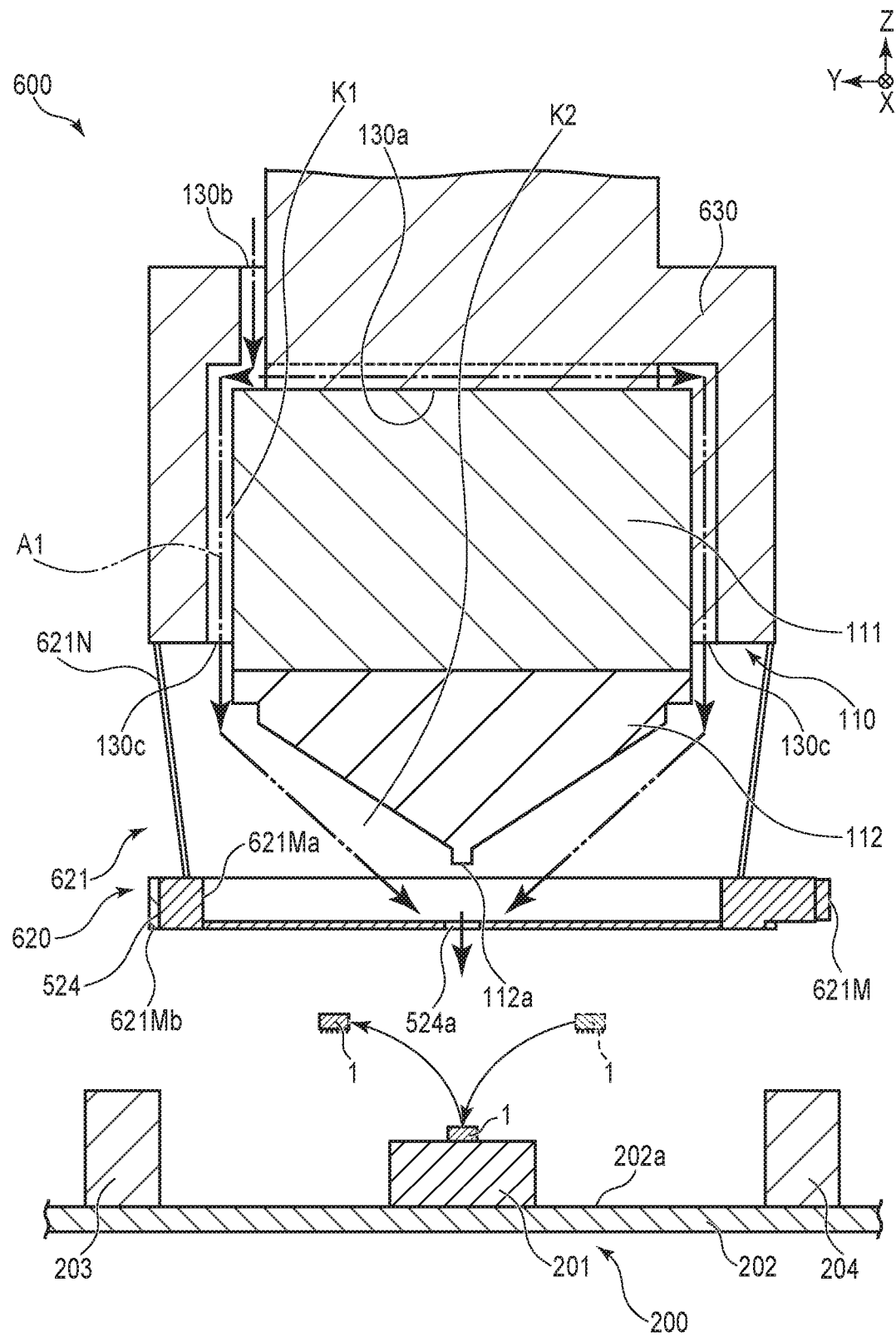
FIG. 12 is a general cross-sectional view of the contactor and the inspection device along the 12-12 line of FIG. 11.
Figure 13:
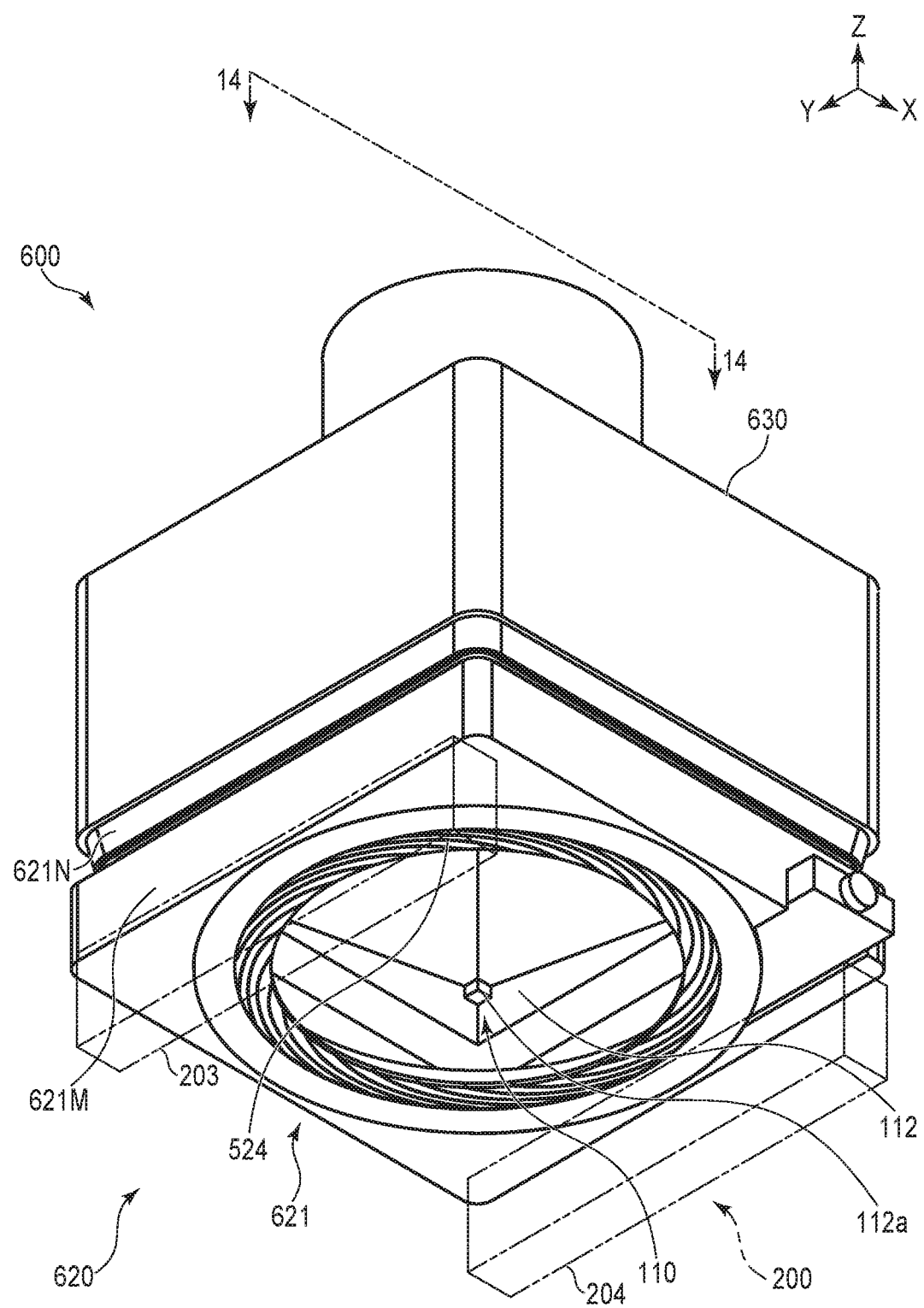
FIG. 13 is a general perspective view showing the state in which the contactor of FIG. 11 descends and is in contact with the inspection device.
Figure 14:
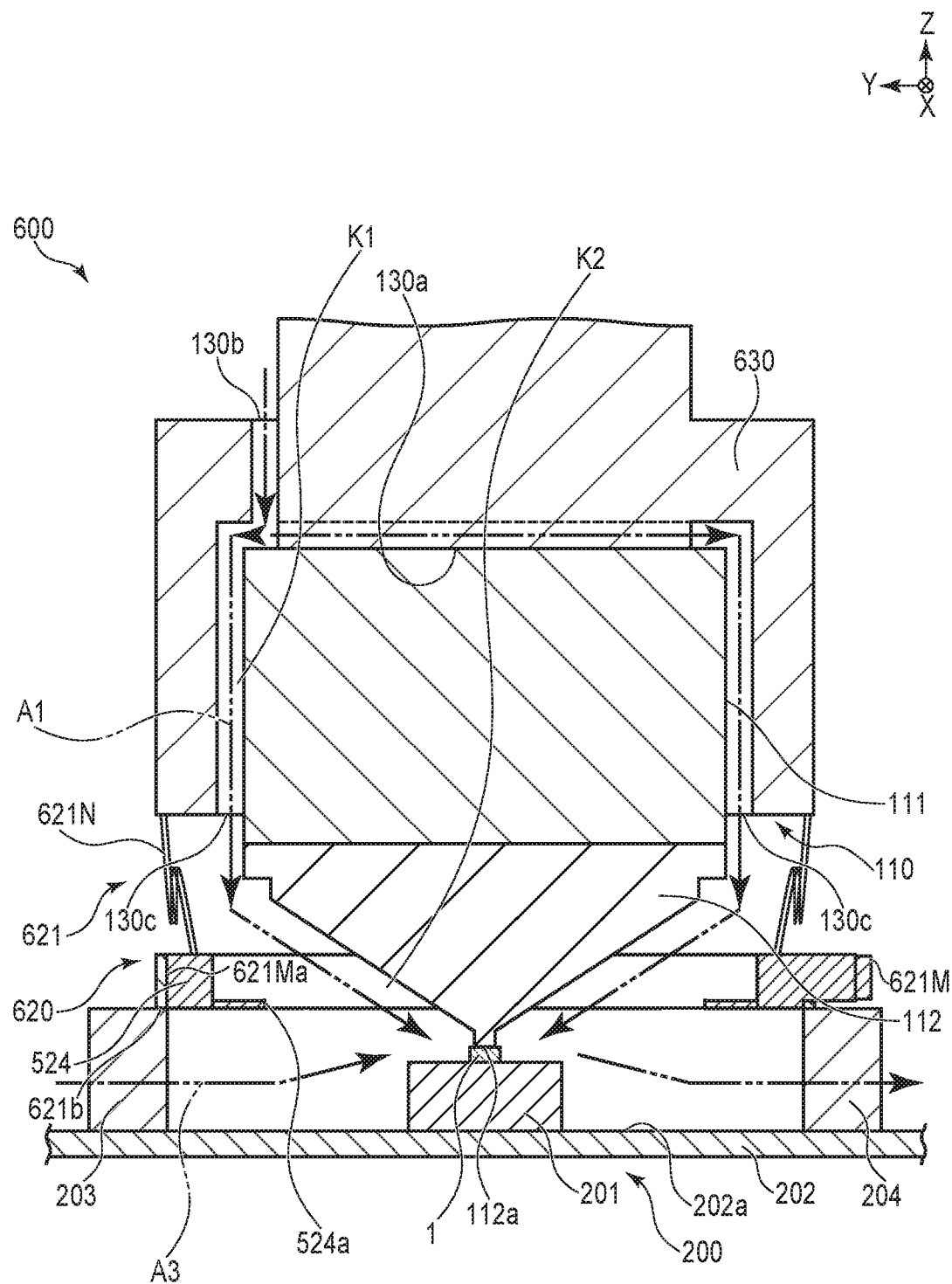
FIG. 14 is a general cross-sectional view of the contactor and the inspection device along the 14-14 line of FIG. 13.

The structure of the contactor 600 of the third embodiment is explained with reference to FIG. 11 to FIG. 14. FIG. 11 is a general perspective view showing a part of the contactor 600 and the inspection device 200 according to the third embodiment. FIG. 12 is a general cross-sectional view of the contactor 600 and the inspection device 200 along the 12-12 line of FIG. 11. FIG. 13 is a general perspective view showing the state in which the contactor 600 of FIG. 11 descends and is in contact with the inspection device 200. FIG. 14 is a general cross-sectional view of the contactor 600 and the inspection device 200 along the 14-14 line of FIG. 13.

The IC handler of the third embodiment comprises the contactor 600 unique to the third embodiment, the inspection device 200, a driving device 300 and a control device 400 which are the same as the first embodiment. Thus, the contactor 600 unique to the IC handler of the third embodiment is explained.

The contactor 600 includes the shielding mechanism 620 and a holding member (connection mechanism) 630 unique to the third embodiment, and the temperature adjustment mechanism 110 which is the same as the first embodiment. The shielding mechanism 620 includes the cover 621 unique to the third embodiment, and the iris diaphragm 524 which is the same as the second embodiment. The cover 621 includes a holder 621M and the bellows 621N. The holder 621M has an annular shape which penetrates in a perpendicular direction Z. Further, the holder 621M comprises an aperture portion 621Ma for attaching the iris diaphragm 524 in the inner circumference, and comprises a lower surface 621Mb on the lower side. The cylindrical bellows 621N which is allowed to extend and retract and penetrates in the perpendicular direction Z is attached to the upper part of the holder 621M. The specification of the bellows 621N may be arbitrarily set in accordance with the moving distance of the holder 621M. In place of the bellows 621N, a telescope may be used. The holding member (connection mechanism) 630 is not directly connected to the cover 621. The upper end of the bellows 621N is attached to the lower end of the holding member 630. The holding member 630 has a shape in which the structure related to the connection with the cover 121 is omitted in the holding member 130 of the first embodiment.

The action and effect of the contactor 600 of the third embodiment are explained with reference to FIG. 11 to FIG. 14.

In the contactor 600 of the third embodiment, the cover 621 comprises the bellows 621N which is allowed to extend and retract.

In this structure, the extension retraction mechanism of the cover 621 can be realized by a very simple structure using the bellows 621N. Specifically, as shown in FIG. 13 and FIG. 14, when the contactor 600 descends, the shielding mechanism 620 is pushed up from a housing unit 202, and the bellows 621N retracts. As shown in FIG. 11 and FIG. 12, when the contactor 600 ascends, the shielding mechanism 620 is spaced apart from the housing unit 202, and the bellows 621N extends.

When the present invention is implemented, the above first to third embodiments are merely examples, and may be changed in various ways with respect to the specific forms.

For example, in the first to third embodiments, this specification explains the structure in which the contactors 100, 500 and 600 are caused to approach and move away from the inspection device 200 which is stopped. The IC handler of the present invention is not limited to the above structure, and may comprise a structure in which the inspection device 200 is caused to approach and move away from the contactors 100, 500 and 600 which are stopped. Further, the IC handler of the present invention may comprise a structure for causing each of the contactors 100, 500 and 600 and the inspection device 200 to move and causing them to relatively approach and move away from each other.

In the first to third embodiments, this specification explains the structure in which the contactors 100, 500 and 600 and the inspection device 200 approach and move away from each other in the perpendicular direction Z. The IC handler of the present invention is not limited to the above structure, and may comprise a structure in which the contactors 100, 500 and 600 and the inspection device 200 approach and move away from each other in, for example, a horizontal direction.

In the first to third embodiment, this specification explains the structure in which the covers 121, 521 and 621 of the contactors 100, 500 and 600 are in contact with the housing unit 202 of the inspection device 200. The IC handler of the present invention is not limited to the above structure, and may comprise a structure for causing the covers 121 and 521 of the contactors 100 and 500 to ascend by a linear motion stage, etc., such that the covers are not in contact with the housing unit 202 of the inspection device 200.

In the first to third embodiments, this specification explains the structure in which dry air is used for gas. The IC handler of the present invention is not limited to the above structure, and for example, may comprise a structure in which inactive nitrogen gas or argon gas is used for gas.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A contactor comprising:
a temperature adjustment mechanism which increases and decreases temperature of an electronic component via a contact portion;
a cover which externally covers the temperature adjustment mechanism and comprises an aperture portion; and
a path allowed to supply gas to inside of the cover, wherein
the cover is configured to change a distance from the aperture portion to the contact portion; and
the contactor further comprises:
a connection mechanism which connects the cover so as to be movable with respect to the temperature adjustment mechanism; and
a bias mechanism which biases the cover in a direction in which the aperture portion moves away from the contact portion such that the contact portion is housed in inside of the aperture portion.

2. The contactor of claim 1, wherein
the temperature adjustment mechanism and the cover are configured to be provided at a first position where the contact portion is housed in inside of the aperture portion and a second position where the contact portion protrudes from the aperture portion to outside.

3. The contactor of claim 1, further comprising
a blower mechanism which forms an air current which blocks the aperture portion.

4. The contactor of claim 1, further comprising
a shielding mechanism allowed to shield the aperture portion.

5. A handler comprising:
a contractor;
an inspection device which inspects an electric property of an electronic component; and
a driving device which causes the contactor and the inspection device to be close to each other and spaced apart from each other, wherein
the contractor comprises:
a temperature adjustment mechanism which increases and decreases temperature of the electronic component via a contact portion;
a cover which externally covers the temperature adjustment mechanism and comprises an aperture portion; and
a path allowed to supply gas to inside of the cover, wherein
the cover is configured to change a distance from the aperture portion to the contact portion.

6. A handler comprising:
a contractor;
an inspection device which inspects an electric property of an electronic component;
a driving device which causes the contactor and the inspection device to be close to each other and spaced apart from each other; and
a control device which controls the driving device, wherein
the contractor comprises:
a temperature adjustment mechanism which increases and decreases temperature of the electronic component via a contact portion;
a cover which externally covers the temperature adjustment mechanism and comprises an aperture portion;
a path allowed to supply gas to inside of the cover; and
a shielding mechanism allowed to shield the aperture portion, wherein
the cover is configured to change a distance from the aperture portion to the contact portion; and
the control device controls the driving device such that the aperture portion is shielded by the shielding mechanism in a state where the contact portion is housed in inside of the aperture portion.

* * * * *